United States Patent
Kawahito

(10) Patent No.: US 10,339,230 B2
(45) Date of Patent: Jul. 2, 2019

(54) SIMULATION APPARATUS AND METHOD OF AN ARTICLE AND A CONVEYOR IN A 3D SIMULATED SPACE

(71) Applicant: FUJITSU LIMITED, Kawasaki-shi, Kanagawa (JP)

(72) Inventor: Masaaki Kawahito, Fuchu (JP)

(73) Assignee: FUJITSU LIMITED, Kawasaki (JP)

( * ) Notice: Subject to any disclaimer, the term of this patent is extended or adjusted under 35 U.S.C. 154(b) by 1499 days.

(21) Appl. No.: 14/087,736

(22) Filed: Nov. 22, 2013

(65) Prior Publication Data

US 2014/0214384 A1 Jul. 31, 2014

(30) Foreign Application Priority Data

Jan. 31, 2013 (JP) .................................. 2013-017915

(51) Int. Cl.
*G06F 17/50* (2006.01)
*G06F 3/01* (2006.01)

(52) U.S. Cl.
CPC .......... *G06F 17/5009* (2013.01); *G06F 3/011* (2013.01); *G06F 3/016* (2013.01)

(58) Field of Classification Search
CPC .................................................. G06F 17/5009
See application file for complete search history.

(56) References Cited

U.S. PATENT DOCUMENTS

| | | | |
|---|---|---|---|
| 6,246,931 B1 | 6/2001 | Shinogi | |
| 9,365,357 B2 * | 6/2016 | Ghezal | .................. G06M 1/101 |
| 9,679,405 B2 * | 6/2017 | Oya | .................. G05B 19/0426 |
| 2007/0088526 A1 * | 4/2007 | Friedrich | ................ G06F 3/012 |
| | | | 702/150 |
| 2008/0082984 A1 * | 4/2008 | McDaniel | ............... G06F 8/311 |
| | | | 718/106 |
| 2010/0177064 A1 * | 7/2010 | Cragun | ................... G06F 3/011 |
| | | | 345/184 |

FOREIGN PATENT DOCUMENTS

JP  3781557  3/2006
JP  2008-93751  4/2008

* cited by examiner

*Primary Examiner* — Aniss Chad
(74) *Attorney, Agent, or Firm* — Staas & Halsey LLP

(57) ABSTRACT

A computing method for a simulation in which an article, a conveyor, and a table are plotted in a three dimensional simulated space, and in which the conveyor conveys the article includes setting a priority representing a degree at which the lifter is handled as a single unit as the article higher than another priority representing a degree at which the table is handled as a single unit as the article when the lifter moves the article placed on the table upwardly, and setting the priority representing a degree at which the lifter is handled as a single unit as the article lower than the priority representing a degree at which the table is handled as a single unit as the article when the lifter conveying the article moves downwardly below the table.

8 Claims, 15 Drawing Sheets

FIG.4

| CONVEYOR | PRIORITY |
|---|---|
| PUSHER | 5 |
| LIFTER | 5 |
| CONVEYOR | 2 |
| TABLE | 1 |
| ⋮ | ⋮ |

| CONVEYOR | FORM |
|---|---|
| LIFTER #1 | $(X_{R1}, Y_{R1}, Z_{R1})$ ⋯ |
| LIFTER #2 | $(X_{R2}, Y_{R2}, Z_{R2})$ ⋯ |
| ⋮ | ⋮ |

| CONVEYOR | POSITION | AMOUNT OF MOVEMENT |
|---|---|---|
| LIFTER #1 | $(X_{R1}, Y_{R1}, Z_{R1})\cdots$ | $(X_1, Y_1, Z_1)$ |
| LIFTER #2 | $(X_{R2}, Y_{R2}, Z_{R2})\cdots$ | $(X_2, Y_2, Z_2)$ |
| ⋮ | ⋮ | ⋮ |

| WORKPIECE | FORM |
|---|---|
| WORKPIECE #1 | $(X_{w1}, Y_{w1}, Z_{w1})\cdots$ |
| WORKPIECE #2 | $(X_{w2}, Y_{w2}, Z_{w2})\cdots$ |
| ⋮ | ⋮ |

| WORKPIECE | ORIENTATION |
|---|---|
| WORKPIECE #1-1 | $(X_1, Y_1, Z_1)$ $(\theta_{w1}, \rho_{w1}, \phi_{w1})$ |
| WORKPIECE #2-1 | $(X_2, Y_2, Z_2)$ $(\theta_{w2}, \rho_{w2}, \phi_{w2})$ |
| ⋮ | ⋮ |

FIG.9

| WORKPIECE | FORM |
|---|---|
| WORKPIECE #1-1 | $(X_{S1}, Y_{S1}, Z_{S1})$ ⋯ |
| WORKPIECE #2-1 | $(X_{S2}, Y_{S2}, Z_{S2})$ ⋯ |
| ⋮ | ⋮ |

FIG.10

| CONVEYOR | CONTACT PLANE |
|---|---|
| LIFTER #1 | $(X_{R1P}, Y_{R1P}, Z_{R1P})$ ⋯ |
| LIFTER #2 | $(X_{R2P}, Y_{R2P}, Z_{R2P})$ ⋯ |
| ⋮ | ⋮ |

SIMULATION APPARATUS AND METHOD OF AN ARTICLE AND A CONVEYOR IN A 3D SIMULATED SPACE

CROSS-REFERENCE TO RELATED APPLICATION

This application is based upon and claims the benefit of priority of the prior Japanese Patent Application No. 2013-017915, filed on Jan. 31, 2013, the entire contents of which are incorporated herein by reference.

FIELD

The embodiments discussed herein are related to a computer program, a computing apparatus, and a computing method.

BACKGROUND

Conventionally known is a technology for simulating how an article, referred to as a workpiece, is conveyed. For example, for the purpose of debugging a control program for controlling a conveyor such as a belt conveyor, a vacuum chuck, a pusher, and a lifter, known is a technology that causes the conveyor to operate in a simulated space based on the control program so as to check if the workpiece would be conveyed appropriately.

A possible method for simulating how a workpiece is conveyed in the simulated space includes detecting a conveyor having been brought into contact with a workpiece, and simulating how the workpiece is conveyed based on the operation of the conveyor upon being brought into contact with the workpiece. However, when simultaneously simulated is conveyance of a number of workpieces or operations of a plurality of conveyors, an enormous amount of computations will be performed to determine, for each of such elements, if each of the conveyors is brought into contact with a workpiece.

In response to this issue, some technologies for simplifying computations required in a simulation are known. An example of such a known technology simulates an operation in which a workpiece conveyed by one conveyor is transferred to and conveyed by another conveyor, for example, by preparing a list defining the order of the conveyors conveying the workpiece in advance, and causing the conveyance state of the workpiece to transition based on the list.

To explain using a specific example, when simulated is an operation in which a workpiece conveyed by a table is picked up by a lifter and transferred onto another table, an information processing apparatus prepares in advance a list for causing the conveyance state of the workpiece to transition from the table to the lifter, and from the lifter to the other table. The information processing apparatus then causes the conveyance state of the workpiece to transition based on the list thus prepared, so as to allow a simulation of an operation in which the workpiece is conveyed by a plurality of conveyors.

Related-art examples are described in Japanese Laid-open Patent Publication No. 2008-093751 and Japanese Laid-open Patent Publication No. 2000-010617.

However, in the technology in which the order of the conveyors conveying a workpiece is defined in advance, because the conveyance state of the workpiece is transitioned in the order thus defined, there is a disadvantage that it is difficult to allow the conveyance state of the workpiece to transition flexibly.

For example, in the information processing apparatus causing the conveyance state of a workpiece to transition based on a list prepared in advance, when a route for conveying the workpiece is changed, e.g., due to a change in the control program, the information processing apparatus needs to create another list in which the new conveyance route is defined.

SUMMARY

According to an aspect of an embodiment, a computer-readable recording medium stores therein a computer program for a simulation in which an article, a conveyor performing an operation of moving the article upwardly by supporting the article from bottom using a supporting surface of a lifter, and a table on which the article is to be placed are plotted in a three dimensional simulated space, and in which the conveyor conveys the article. The computer program causes a computer to execute a process including: setting a priority representing a degree at which the lifter is handled as a single unit as the article higher than another priority representing a degree at which the table is handled as a single unit as the article when the lifter moves the article placed on the table upwardly; and setting the priority representing a degree at which the lifter is handled as a single unit as the article lower than the priority representing a degree at which the table is handled as a single unit as the article when the lifter conveying the article moves downwardly below the table.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 is a schematic for explaining an example of a conveyor priority table;

FIG. 5 is a schematic for explaining an example of a lifter component form table;

FIG. 6 is a schematic for explaining an example of a lifter operation information table;

FIG. 7 is a schematic for explaining an example of a workpiece form table;

FIG. 8 is a schematic for explaining an example of a workpiece orientation table;

FIG. 9 is a schematic for explaining an example of a contact determining cuboid table;

FIG. 10 is a schematic for explaining an example of a lifter contact plane table;

DESCRIPTION OF EMBODIMENTS

Preferred embodiments of the present invention will be explained with reference to accompanying drawings.

[a] First Embodiment

Figure 1:
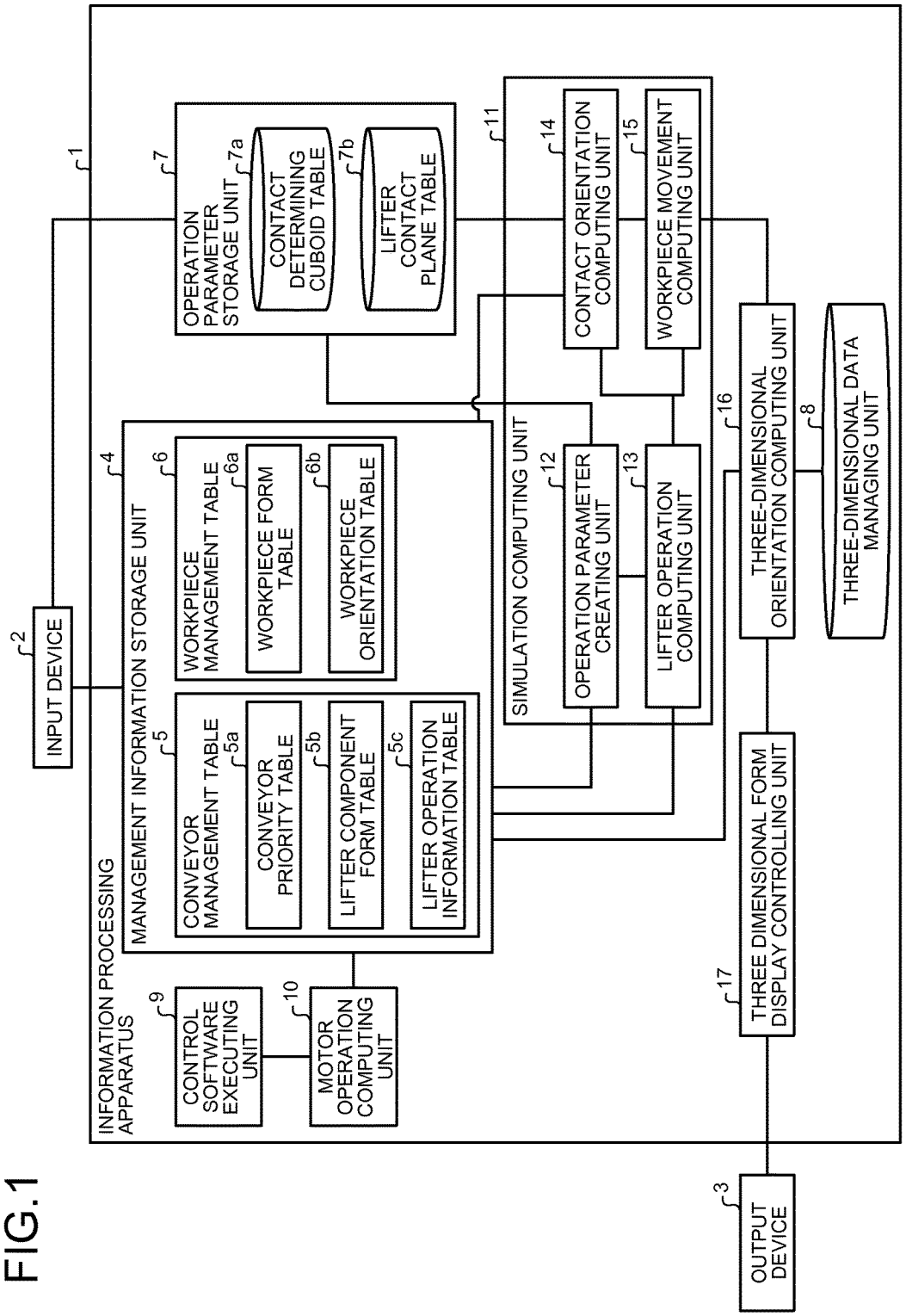
FIG. 1 is a schematic for explaining a functional configuration of an information processing apparatus according to a first embodiment.

Explained in a first embodiment is an information processing apparatus for simulating conveyance of a workpiece. FIG. 1 is a schematic for explaining a functional configuration of such an information processing apparatus according to the first embodiment. As illustrated in FIG. 1, this information processing apparatus 1 is connected to an input device 2 and an output device 3. The information processing apparatus 1 includes a management information storage unit 4, an operation parameter storage unit 7, and a three-dimensional data managing unit 8. The information processing apparatus 1 also includes a control software executing unit 9, a motor operation computing unit 10, a simulation computing unit 11, a three-dimensional orientation computing unit 16, and a three dimensional form display controlling unit 17.

The management information storage unit 4 also includes a conveyor management table 5 and a workpiece management table 6. The conveyor management table 5 includes a conveyor priority table 5a, a lifter component form table 5b, and a lifter operation information table 5c. The workpiece management table 6 includes a workpiece form table 6a and a workpiece orientation table 6b. The operation parameter storage unit 7 includes a contact determining cuboid table 7a and a lifter contact plane table 7b. The simulation computing unit 11 includes an operation parameter creating unit 12, a lifter operation computing unit 13, a contact orientation computing unit 14, and a workpiece movement computing unit 15.

Such an information processing apparatus 1 receives information such as the form of a workpiece whose conveyance is to be simulated in the simulated space, and positions, functions, and the like of conveyors conveying the workpiece, from the input device 2, for example. For example, the information processing apparatus 1 receives three dimensional model data of a workpiece created on a computer aided design (CAD). The information processing apparatus 1 also receives three dimensional model data of conveyors such as a belt conveyor, a vacuum chuck, a pusher, and a lifter created on a CAD, and a positional relation and the like of the conveyors.

The information processing apparatus 1 then simulates conveyance of the workpiece using the three dimensional model data and the like thus received, and outputs the execution result to the output device 3 such as a monitor or a printer. For example, the information processing apparatus 1 outputs an image of the workpiece being conveyed by these different types of conveyors thus input to the output device 3, and causes the output device 3 to display the image.

In order to simplify the computations for a simulation, the information processing apparatus 1 performs the computations by handling a workpiece and a conveyor conveying the workpiece as a single unit so that the amount of computations performed in the simulation is reduced. For example, the information processing apparatus 1 sets a conveyable region of a predetermined size to a workpiece conveying surface of each of the conveyors.

The information processing apparatus 1 determines that a conveyor has started conveying a workpiece when, at one time step, the center of gravity of the workpiece comes to be included in the conveyable region set to the conveyor, and performs computations for a simulation by handling the conveyor and the workpiece as a single unit. In other words, the information processing apparatus 1 reduces the amount of computations by computing only the operation of the conveyor having been unified with the workpiece, without computing the movement of the workpiece.

Figure 2:
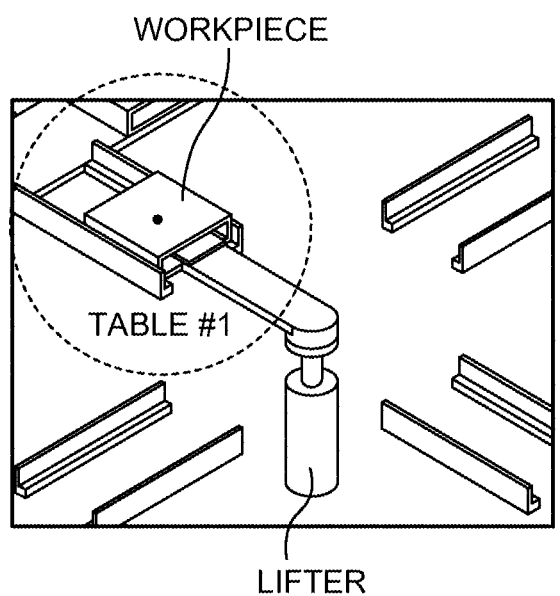
FIG. 2 is a first schematic for explaining an operation of a lifter.
Figure 3:
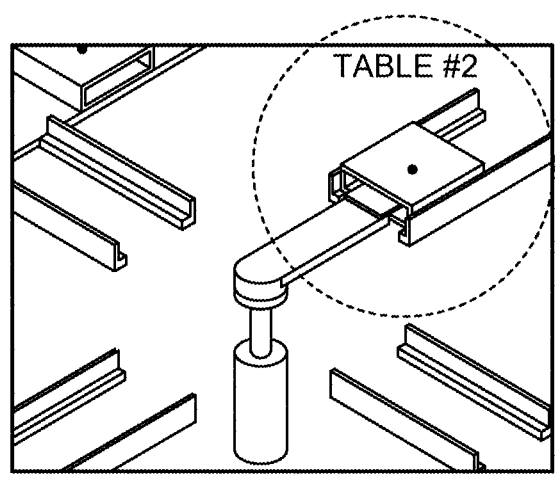
FIG. 3 is a second schematic for explaining an operation of the lifter.

Explained now with reference to FIGS. 2 and 3 is an example in which simulated is an operation in which a workpiece being conveyed by one table is picked up by a lifter, and the lifter conveys the workpiece to another table. For example, FIG. 2 is a first schematic for explaining such an operation of the lifter. In the example illustrated in FIG. 2, the information processing apparatus 1 simulates an operation in which a workpiece conveyed by a table #1 is picked up by a lifter.

For example, a possible approach for simulating such an operation is to set a priority at which a conveyor is unified with the workpiece to each of these conveyors, and to cause the conveyance state of the workpiece to transition based on the priorities. For example, the information processing apparatus 1 sets a priority "1" to the table #1 and the table #2, and sets a priority "5" to the lifter.

When the workpiece on the table #1 comes to be included in the conveyable region of the lifter, the information processing apparatus 1 compares the priority of the table #1 with that of the lifter, and determines that the lifter has a higher priority. Once the priority of the lifter is determined to be higher, the information processing apparatus 1 cancels the unification of the workpiece and the table #1, and then unifies the workpiece with the lifter. The information processing apparatus 1 then simulates conveyance of the workpiece by computing the operation of the lifter having been unified with the workpiece.

However, the information processing apparatus 1 is not capable of simulating the operation of the lifter conveying the workpiece from the one table to another table solely by setting priorities to these conveyors. For example, FIG. 3 is a second schematic for explaining such an operation of the lifter. Illustrated in the example in FIG. 3 is an operation of the lifter conveying the workpiece picked up from the table #1 onto the table #2. For example, when the workpiece unified with the lifter comes to be included in the conveyable region of the table #2, the information processing apparatus 1 compares the priority of the lifter with that of the table #2. The information processing apparatus 1 then falls incapable of simulating the operation of transferring the workpiece from the lifter onto the table, because the priority set to the lifter is higher.

In response to this issue, the information processing apparatus 1 executes the following process. To begin with, the information processing apparatus 1 specifies a higher priority of the lifter than those of the tables in advance. The information processing apparatus 1 then causes the conveyance state of the workpiece to transition based on the preset priorities while the lifter is moving upwardly. The information processing apparatus 1 updates the priority specified to the lifter to a value lower than the priorities specified to the tables when the lifter is not moving or is moving downwardly.

As a result, the information processing apparatus 1 becomes capable of simulating operation such as a lifter lifting a workpiece placed on the table #1, conveying the workpiece above the table #2, and placing the workpiece onto the table #2. In this manner, the information processing apparatus 1 is allowed to simulate conveyance of a workpiece, even without using any list in which the order of the conveyors conveying the workpiece is defined. Therefore, a change in the order of the conveyors or the like can be accommodated flexibly.

Referring back to FIG. 2, a function achieved by each of the functional units included in the information processing apparatus 1 will be explained. Information stored in the conveyor priority table 5a, the lifter component form table 5b, and the lifter operation information table 5c included in the conveyor management table 5 will now be explained with reference to FIGS. 4 to 6.

The conveyor priority table 5a is a table storing therein each of the conveyors in a simulated space in a manner associated with a priority at which the conveyor is unified with a workpiece. For example, FIG. 4 is a schematic for explaining an example of the conveyor priority table. In the example illustrated in FIG. 4, the conveyor priority table 5a stores therein a "pusher" that pushes the workpiece in a manner associated with a priority "5", and a "lifter" that lifts to convey a workpiece in a manner associated with a priority "5".

The conveyor priority table 5a also stores therein a "conveyor" that conveys a workpiece in a manner associated with a priority "2", and a "table" on which a workpiece is placed in a manner associated with a priority "1". The conveyor priority table 5a stores therein a priority of each of the conveyors, for each type of a workpiece in the simulated space.

The lifter component form table 5b is a table storing therein data representing the form of the lifter entered via the input device 2. For example, FIG. 5 is a schematic for explaining an example of the lifter component form table. In the example illustrated in FIG. 5, the lifter component form table 5b stores therein the coordinates of each vertex included in triangular planes (polygon) making up the surfaces of each of the lifters plotted in the simulated space, as the form of the lifter.

For example, the lifter component form table 5b stores therein the coordinates "$(X_{R1}, Y_{R1}, Z_{R1})$ . . ." of each vertex of a plurality of polygons making up a surface of the lifter #1, and stores therein "$(X_{R2}, Y_{R2}, Z_{R2})$ . . ." of each vertex of a plurality of polygons making up a surface of the lifter #2. Illustrated in FIG. 5 is an example in which the simplest polygon data is stored, but the embodiment is not limited thereto, and the lifter component form table 5b may store therein polygon data considering side data, for example. The lifter component form table 5b may also store therein lines making up a free-form surface, or points making up a line in a hierarchical manner. In other words, the lifter component form table 5b stores therein data of any format representing a lifter in the simulated space.

The lifter operation information table 5c is a table storing therein data representing a lifter operation. For example, FIG. 6 is a schematic for explaining an example of the lifter operation information table. In the example illustrated in FIG. 6, the lifter operation information table stores therein, for each of the lifters, the center of gravity of a cuboid circumscribed around the lifter, which is hereinafter referred to as a contact determination cuboid for the lifter, and a moving direction and a vector representing the amount of a movement of the contact determination cuboid, in an associated manner.

For example, in the example illustrated in FIG. 6, the lifter operation information table 5c stores therein that the center of gravity of the contact determination cuboid for the lifter #1 at one time step is "$(X_{R1}, Y_{R1}, Z_{R1})$ . . .". The lifter operation information table 5c also stores therein the amount of movement of the contact determination cuboid for the lifter #1 at one time step is "$(X_1, Y_1, Z_1)$". The lifter operation information table 5c also stores therein that the center of gravity of the contact determination cuboid for the lifter #2 is "$(X_{R2}, Y_{R2}, Z_{R2})$ . . .". The lifter operation information table 5c also stores therein that the amount of movement of the contact determination cuboid for the lifter #2 is "$(X_2, Y_2, Z_2)$". The amount of movement of each of the lifter #1 and the lifter #2 is updated to values newly computed by the motor operation computing unit 10 at each time step at which the information processing apparatus 1 performs the simulation.

Explained now with reference to FIGS. 7 and 8 is information stored in the workpiece form table 6a and the workpiece orientation table 6b included in the workpiece management table 6 illustrated in FIG. 2. The workpiece form table 6a stores therein the form of a workpiece to be conveyed by various types of conveyors in the simulated space.

For example, FIG. 7 is a schematic for explaining an example of the workpiece form table. In the example illustrated in FIG. 7, the workpiece form table 6a stores therein the coordinates of each vertex of a triangular plane (polygon) making up a surface of the workpiece. Specifically, the workpiece form table 6a stores therein coordinate data of a polygon making up a surface of a workpiece #1 "$(X_{W1}, Y_{W1}, Z_{W1})$ . . .", and stores therein coordinate data of a polygon making up a surface of a workpiece #2 "$(X_{W1}, Y_{W1}, Z_{W2})$ . . .". The workpiece form table 6a may also store therein data representing a free-form surface and the like, in the same manner as in the lifter component form table 5b.

The workpiece orientation table 6b is a table storing therein data representing an orientation of a workpiece. For example, FIG. 8 is a schematic for explaining an example of a workpiece orientation table. In the example illustrated in FIG. 8, the workpiece orientation table stores therein information representing a position of the contact determination cuboid for each of the workpieces, that is, a cuboid circumscribed around the workpiece, and orientation information indicating how much the workpiece is rotated about each axis of the three dimensional space, using the center of gravity of the contact determination cuboid as the point of origin.

For example, in the example illustrated in FIG. 8, the workpiece orientation table 6b stores therein that the orientation of a workpiece #1-1 is "$(X_1, Y_1, Z_1)$, $(\theta_{W1}, \rho_{W1}, \phi_{W1})$", and that the orientation of a workpiece #2-1 is "$(X_2, Y_2, Z_2)$, $(\theta_{W1}, \rho_{W1}, \phi_{W2})$". Where, $\theta$, $\rho$, and $\phi$ is information indicating that how much the workpiece is rotated about each of the axes of the three dimensional space.

Explained now with reference to FIGS. 9 and 10 is information stored in the contact determining cuboid table 7a and the lifter contact plane table 7b included in the operation parameter storage unit 7 illustrated in FIG. 2. To begin with, the information stored in the contact determining cuboid table 7a will be explained with reference to FIG. 9. FIG. 9 is a schematic for explaining an example of the contact determining cuboid table.

In the example illustrated in FIG. 9, the contact determining cuboid table 7a stores therein data of a polygon making up a surface of the contact determination cuboid that is a cuboid circumscribed around each of the workpieces. For example, the contact determining cuboid table 7a stores therein "$(X_{S1}, Y_{S1}, Z_{S1}) \ldots$", as data of a polygon making up a surface of the contact determination cuboid for the workpiece #1-1. The contact determining cuboid table 7a also stores therein "$(X_{S2}, Y_{S2}, Z_{S2}) \ldots$", as data of a polygon making up a surface of the contact determination cuboid for the workpiece #2-1.

The information stored in the lifter contact plane table 7b will now be explained with reference to FIG. 10. FIG. 10 is a schematic for explaining an example of the lifter contact plane table. In the example illustrated in FIG. 10, the lifter contact plane table 7b stores therein, for each type of the conveyors, data of coordinates representing each vertex of a contact plane to be unified with a workpiece when the workpiece is to be conveyed.

For example, the lifter contact plane table 7b stores therein a contact plane "$(X_{R1P}, Y_{R1P}, Z_{R1P}) \ldots$" for the lifter #1, and a contact plane "$(X_{R2P}, Y_{R2P}, Z_{R2P}) \ldots$" for the lifter #2. Although not illustrated in FIG. 10, the polygon data includes data indicating which side of the contact plane of each of the lifters is brought into contact with a workpiece.

In the example described above, the lifter component form table 5b, the lifter operation information table 5c, and the lifter contact plane table 7b respectively store therein different types of information of the lifters. However, the management information storage unit 4 and the operation parameter storage unit 7 also store therein tables storing therein forms, positions, and amounts of movement of a pusher, a conveyor, a table, and the like plotted in the simulated space, in the same manner as for the lifters. The contact determination cuboid explained above may be a cuboid entered via the input device 2.

Referring back to FIG. 1, the three-dimensional data managing unit 8 stores therein various types of data to be used for creating a simulated image. For example, the three-dimensional data managing unit 8 stores therein polygon data of each of the workpieces and the conveyors, and information specifying the colors to be used in displaying.

The control software executing unit 9 executes control software to be debugged. For example, in a factory to be simulated, the control software executing unit 9 executes control software for generating a control signal for a servo motor for causing each of the conveyors to operate. The control software executing unit 9 then outputs details specified in the control signals generated by the control software to the motor operation computing unit 10. To explain using a specific example, the control software executing unit 9 notifies the motor operation computing unit 10 of time and timing at which a pulse signal indicating ON and OFF of the servo motor is set to ON, and a negative or a positive direction of the pulse, for example.

The motor operation computing unit 10 computes the rotational frequency and the like of a servo motor causing corresponding one of the conveyors to operate based on the details specified in the control signal received from the control software executing unit 9. The motor operation computing unit 10 then generates a vector indicating the moving direction and the amount of movement of the corresponding conveyor using the computation result, and stores the vector thus generated in the lifter operation information table 5c. For example, upon receiving details specified in a control signal for a servo motor causing a lifter to operate, the motor operation computing unit 10 computes the rotating direction and the rotational frequency of the servo motor based on the control signal thus received. The motor operation computing unit 10 then calculates a vector representing the operation of the lifter using the servo motor rotations thus computed, and stores the vector thus calculated in the lifter operation information table 5c.

Processes performed by the operation parameter creating unit 12, the lifter operation computing unit 13, the contact orientation computing unit 14, and the workpiece movement computing unit 15 included in the simulation computing unit 11 will now be explained. The operation parameter creating unit 12 generates operation parameters using various types of information stored in the management information storage unit 4, and stores the operation parameters thus generated in the operation parameter storage unit 7.

The operation parameters herein are information used when the information processing apparatus 1 simulates a workpiece being conveyed. Specifically, the operation parameters are information used in a contact determination for determining whether each of the workpieces is in contact with each of the conveyors. Examples of the operation parameters include position information of a contact determination cuboid circumscribed around a workpiece, and position information of a contact plane on which a lifter conveys the workpiece.

An operation performed by the operation parameter creating unit 12 will now be explained. To begin with, the operation parameter creating unit 12 acquires the form of each of the workpieces and the orientation of the workpiece at certain timing from the workpiece form table 6a and the workpiece orientation table 6b, respectively. The operation parameter creating unit 12 then creates data of a polygon making up the surfaces of a contact determination cuboid circumscribed around each of the workpieces, and stores the polygon data thus created in the contact determining cuboid table 7a.

Figure 11:
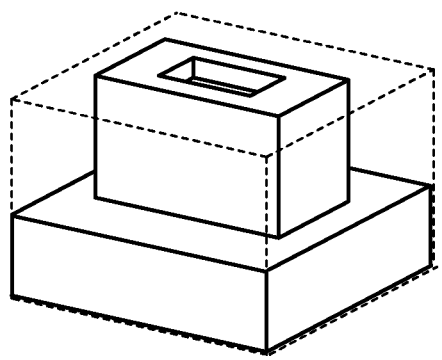
FIG. 11 is a schematic for explaining a contact determination cuboid for a workpiece.

FIG. 11 is a schematic for explaining a contact determination cuboid for a workpiece. For example, as a contact determination cuboid for a workpiece that is illustrated in a solid line in FIG. 11, the operation parameter creating unit 12 identifies a cuboid illustrated in a dotted line in FIG. 11. In other words, the operation parameter creating unit 12 identifies a cuboid circumscribed around the workpiece. The operation parameter creating unit 12 then generates polygon data of a polygon making up a surface of the cuboid thus identified, and stores the polygon data thus generated in the contact determining cuboid table 7a.

The operation parameter creating unit 12 receives a new position of the lifter from the lifter operation computing unit 13. In other words, the operation parameter creating unit 12 receives new position information of the lifter having moved based on the computation result from the motor operation computing unit 10. The operation parameter creating unit 12 then generates polygon data of a polygon making up the contact plane of each of the lifters, and vector data indicating the orientation of the contact plane using the lifter position thus received. The operation parameter creating unit 12 then stores the polygon data and the vector data thus generated in the lifter contact plane table 7b.

The operation parameter creating unit 12 also receives a new position of the conveyors other than the lifters from the lifter operation computing unit 13. The operation parameter creating unit 12 then generates polygon data of the contact plane of each of the conveyors and vector data indicating the orientation of the contact plane, and stores the polygon data and the vector data thus generated in the lifter contact plane table 7b.

The lifter operation computing unit 13 computes an operation of each of the lifters in the simulated space. Specifically, the lifter operation computing unit 13 acquires the form of each of the lifters stored in the lifter component form table 5b, and the position of and the amount of movement of each of the lifters stored in the lifter operation information table 5c, both of which are stored in the conveyor management table 5.

The lifter operation computing unit 13 then generates a new position of the lifter and a vector indicating the direction in which the lifter moves. The lifter operation computing unit 13 then outputs the new position of the lifter and the vector indicating the direction in which the lifter moves thus generated to the operation parameter creating unit 12, the contact orientation computing unit 14, and the workpiece movement computing unit 15.

For each of the conveyors other than the lifters caused to operate by a motor and the like, the lifter operation computing unit 13 also generates a new position and a vector indicating the moving direction, and outputs the position and the vector thus generated to the operation parameter creating unit 12, the contact orientation computing unit 14, and the workpiece movement computing unit 15.

The contact orientation computing unit 14 performs a contact determination for a workpiece, using the information stored in the operation parameter storage unit 7, and new positions of the lifters, the directions in which the lifter moves, and the like received from the lifter operation computing unit 13. Specifically, the contact orientation computing unit 14 acquires the position of the contact determination cuboid and the contact plane of each of the conveyors from the operation parameter storage unit 7.

Figure 12:
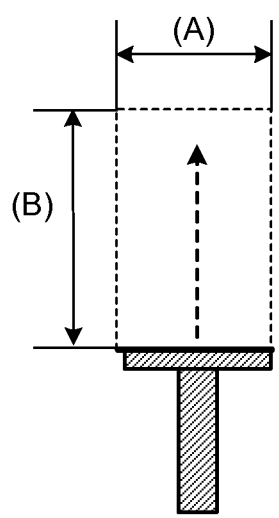
FIG. 12 is a schematic for explaining a conveyable region of a lifter.

The contact orientation computing unit 14 sets a conveyable region on the contact plane of a conveyor so that it can be determined whether a workpiece is started being conveyed. For example, FIG. 12 is a schematic for explaining the conveyable region of a lifter. The contact orientation computing unit 14 sets a conveyable region having a width that is calculated from the form of the lifter, as indicated by (A) in FIG. 12, and having a height calculated from the height of the workpiece to be conveyed by the lifter, as indicated by (B) in FIG. 12. The contact orientation computing unit 14 sets a conveyable region on the contact plane of the lifter, in a direction perpendicular to the contact plane, that is, in the vertical direction.

The contact orientation computing unit 14 calculates the center of gravity of each of the contact determination cuboids each corresponding to a workpiece, and determines a conveyable region including each of the centers of gravity thus calculated. Because a conveyable region is set to each of the conveyors, the center of gravity of a workpiece appropriately being conveyed is included in the conveyable region of the conveyor. Therefore, the contact orientation computing unit 14 notifies the workpiece movement computing unit 15 of the workpiece whose center of gravity is included in a conveyable region, and the conveyor specified with the conveyable region.

The contact orientation computing unit 14 identifies the center of gravity of a movable workpiece whose center of gravity is included in a plurality of conveyable regions. An example of the workpiece having such center of gravity is a workpiece that is placed on a table and about to be conveyed by a lifter or a pusher. The contact orientation computing unit 14 then reads the priority corresponding to the workpiece whose center of gravity is included in a plurality of conveyable regions from the conveyor priority table 5a. The contact orientation computing unit 14 then compares the priorities of the conveyors, each specified with a conveyable region, and executes the following process for a conveyor specified with a higher priority.

To begin with, the contact orientation computing unit 14 detects the end point closest to the contact plane of a conveyor with a higher priority, from the endpoints of the contact determination cuboid for the workpiece, and detects the side closest to the contact plane of the conveyor with a higher priority, from the sides of the contact determination cuboid for the workpiece. The contact orientation computing unit 14 then determines how the workpiece is to be rotated about the end point, in order to bring the side thus detected in parallel with the contact plane of the workpiece.

Figure 13:
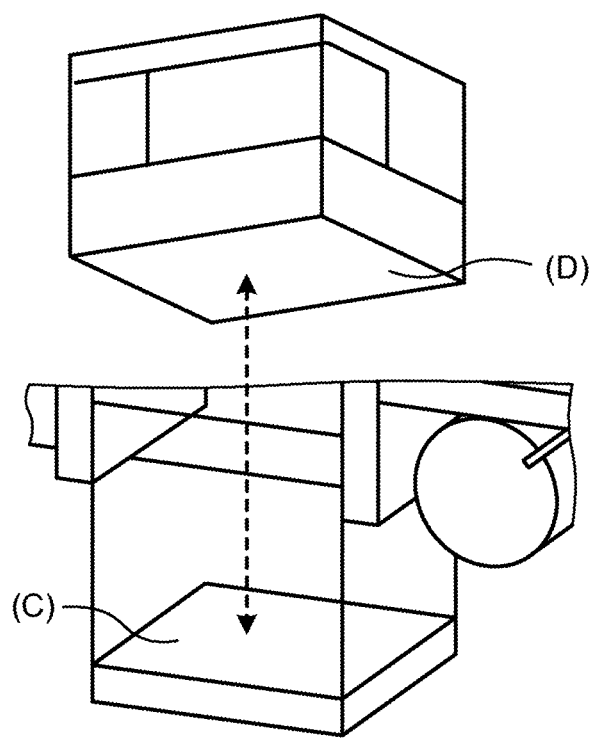
FIG. 13 is a schematic for explaining a contact plane.

For example, FIG. 13 is a schematic for explaining a contact plane. The contact orientation computing unit 14 rotates the workpiece so that the contact plane (C) of the lifter illustrated in FIG. 13 becomes in parallel with the plane (D) of the contact determination cuboid for the workpiece illustrated in FIG. 13. The plane (D) is the plane closest to the contact plane of the lifter. In this manner, the contact orientation computing unit 14 can avoid simulating a workpiece being conveyed in a manner buried in the lifter, for example.

The contact orientation computing unit 14 then calculates the time required for the workpiece having rotated in a specified direction to be brought into contact with the contact plane. The contact orientation computing unit 14 then notifies the workpiece movement computing unit 15 of the workpiece whose center of gravity is included in a plurality of conveyable regions, a conveyor having the highest priority, and the time required for the workpiece to be brought into contact with conveyor.

The contact orientation computing unit 14 executes the following process before comparing the priorities. Specifically, the contact orientation computing unit 14 determines if the conveyor whose priority is to be compared is a lifter. When the conveyor whose priority to be compared is a lifter, the contact orientation computing unit 14 determines if the lifter is moving upwardly based on the moving direction of the lifter received from the lifter operation computing unit 13.

If the contact orientation computing unit 14 determines that the lifter is moving upwardly, the contact orientation computing unit 14 compares the priorities of these conveyors using the priorities read from the conveyor priority table 5a. If the contact orientation computing unit 14 determines that the lifter is not moving or moving downwardly, the contact orientation computing unit 14 corrects the priority of the lifter to the lowest priority, e.g., to zero, and compares the priorities of the conveyors.

For example, when a lifter moving upwardly is to pick up a workpiece placed on a table, the contact orientation computing unit 14 determines that the lifter has a higher priority than the table. When a lifter conveying a workpiece is to transfer the workpiece onto a table while moving downwardly, or when a pusher is to push a workpiece having conveyed by a lifter no longer moving, for example, the contact orientation computing unit 14 determines that the lifter has a lower priority. In this manner, the information processing apparatus 1 can realize a simulation in which a workpiece being conveyed by a lifter moving downwardly is placed onto a table, for example, without preparing a list indicating the transition state of the workpiece in advance.

Referring back to FIG. 1, the workpiece movement computing unit 15 computes the movement of a workpiece being conveyed. For example, the workpiece movement computing unit 15 receives a notification of a workpiece whose center of gravity is included in one conveyable region and a conveyor specified with such a conveyable region from the contact orientation computing unit 14. The workpiece movement computing unit 15 then computes the movement of the workpiece assuming that the workpiece is unified with the conveyor both of which are thus notified.

For example, the workpiece movement computing unit 15 receives a position and a moving direction of a conveyor from the lifter operation computing unit 13. The workpiece movement computing unit 15 establishes the conveyor thus notified from the contact orientation computing unit 14 as a parent object, and establishes the workpiece thus notified as a child object. The workpiece movement computing unit 15 then calculates a new position of the workpiece, which is the child object, by moving the conveyor based on the position, the moving direction, and the like of the conveyor received from the lifter operation computing unit 13.

The workpiece movement computing unit 15 executes the following process when the workpiece movement computing unit 15 receives a workpiece whose center of gravity is included in a plurality of conveyable regions, the conveyor having a higher priority, and the time for the workpiece to be brought into contact with the conveyor from the contact orientation computing unit 14. To begin with, for the simulation before the time thus notified is elapsed, the workpiece movement computing unit 15 computes a movement of the workpiece assuming that the workpiece is unified with the conveyor currently conveying the workpiece, that is, the conveyor with a lower priority.

Once the time thus notified is elapsed, the workpiece movement computing unit 15 cancels the unification of the workpiece and the conveyor with a lower priority, and starts assuming that the workpiece is unified with the conveyor with a higher priority. The workpiece movement computing unit 15 then computes a movement of the workpiece based on the movement of the conveyor thus unified.

When the workpiece is unified with the lifter as a conveyor with a higher priority, the workpiece movement computing unit 15 stores therein the workpiece thus unified and the position of the workpiece when the workpiece is unified with the lifter. The workpiece movement computing unit 15 also determines if the height of the center of gravity of the workpiece unified with the lifter moving downwardly is lower than the height thus stored, that is, if the position of the workpiece is lower than the position at which the workpiece is unified with the lifter.

If the workpiece movement computing unit 15 determines that the position of the workpiece is lower than the position at which the workpiece is unified with the lifter, the workpiece movement computing unit 15 further determines if the workpiece has moved more than a particular threshold in the horizontal direction. In other words, the workpiece movement computing unit 15 determines if a horizontal component of the vector whose starting point is at the workpiece position thus stored and whose end point is at the current workpiece position is larger than a particular threshold.

If the workpiece movement computing unit 15 determines that the workpiece has not moved more than the particular threshold in the horizontal direction, the workpiece movement computing unit 15 cancels the unification of the workpiece and the lifter, and changes the orientation of the workpiece to that of when the workpiece is started being conveyed. If the workpiece movement computing unit 15 determines that the workpiece has moved more than the particular threshold in the horizontal direction, the workpiece movement computing unit 15 computes the workpiece position while keeping the workpiece unified with the lifter.

When the workpiece movement computing unit 15 computes the positions of a plurality of workpieces, the workpiece movement computing unit 15 notifies the three-dimensional orientation computing unit 16 of the position of each of the workpieces. The workpiece movement computing unit 15 also outputs a new position of each operating conveyor, among a plurality of conveyors, to the three-dimensional orientation computing unit 16.

The three-dimensional orientation computing unit 16 receives the position of each of the workpieces and the position of each of the conveyors from the workpiece movement computing unit 15. The three-dimensional orientation computing unit 16 then reads the form of each of the workpieces and the form of each of the conveyors stored in the three-dimensional data managing unit 8. The three-dimensional orientation computing unit 16 then establishes a simulated space in which the forms of the respective workpieces and the respective conveyors thus read are plotted in the respective positions received from the workpiece movement computing unit 15, and notifies the three dimensional form display controlling unit 17 of information of the simulated space thus established.

The three-dimensional orientation computing unit 16 also stores the positions and the orientations of the respective workpieces in the workpiece orientation table 6*b*, and stores the positions of the respective lifters in the lifter operation information table 5*c*. The three-dimensional orientation computing unit 16 also stores the positions of other conveyors in the conveyor management table 5.

The three dimensional form display controlling unit 17 generates pixels for allowing the output device 3 to display the simulated space. For example, upon receiving the information of the simulated space from the three-dimensional orientation computing unit 16, the three dimensional form display controlling unit 17 generates pixels of the simulated space thus received using a Z-buffer or a scan-line algorithm, and transmits the pixels thus generated to the output device 3.

For example, the control software executing unit 9, the motor operation computing unit 10, the simulation computing unit 11, the three-dimensional orientation computing unit 16, and the three dimensional form display controlling unit 17 are configured as an electronic circuit. As an example of an electronic circuit, an integrated circuit such as an application specific integrated circuit (ASIC) or a field programmable gate array (FPGA), or a central processing unit (CPU) or a micro processing unit (MPU) is applied.

The management information storage unit 4, the operation parameter storage unit 7, and the three-dimensional data managing unit 8 are a storage device, e.g., a semiconductor memory device such as a random access memory (RAM) or a flash memory, or a storage device such as a hard disk or an optical disk.

Figure 14A:
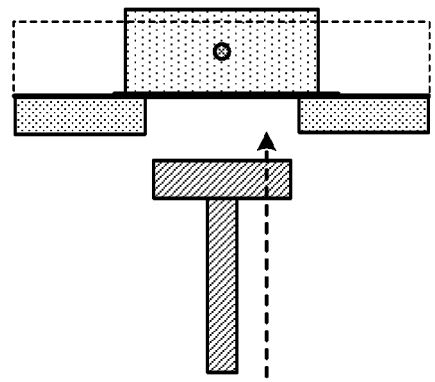
FIG. 14A is a first schematic for explaining a movement of a workpiece when a lifter is moving upwardly.
Figure 14B:
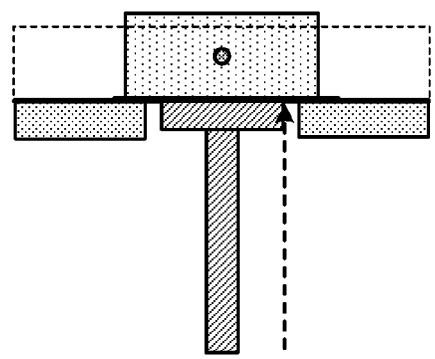
FIG. 14B is a second schematic for explaining the movement of the workpiece when the lifter is moving upwardly.
Figure 14C:
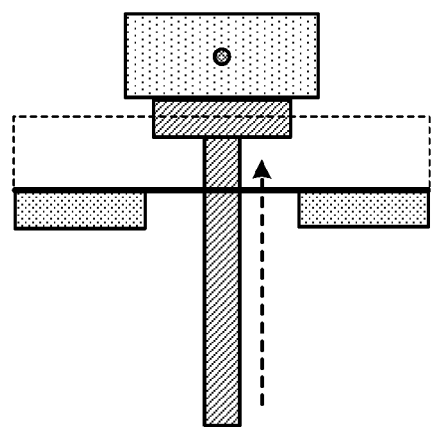
FIG. 14C is a third schematic for explaining the movement of the workpiece when the lifter is moving upwardly.

Details of a simulation performed by the information processing apparatus 1 will now be explained with reference to FIGS. 14A to 14C, FIGS. 15A to 15C, and FIGS. 16A and 16B. Explained with reference to FIGS. 14A to 14C is a simulation in which a lifter moving upwardly picks up a workpiece on a table. FIG. 14A is a first schematic for explaining a movement of a workpiece when the lifter is moving upwardly. FIG. 14B is a second schematic for explaining the movement of the workpiece when the lifter is moving upwardly. FIG. 14C is a third schematic for explaining the movement of the workpiece when the lifter is moving upwardly.

In FIGS. 14A to 14C, the workpiece is illustrated in a thin dotted hatching, and the table is illustrated in a tight dotted hatching. The lifter is filled with diagonals, and the center of gravity of the workpiece is indicated in a manner darkly hatched. A conveyance startable region of the table is surrounded by a dotted line. In the example illustrated in FIGS. 14A to 14C, the lifter is assigned with a higher priority than that of the table.

For example, as illustrated in FIG. 14A, the workpiece is set on the table, and the lifter is coming up from below of the table. In such a case, because the contact plane of the workpiece is in parallel with the contact plane of the lifter, the information processing apparatus 1 continues the simulation until the contact plane of the lifter is brought into contact with the workpiece, without rotating the workpiece.

The lifter is then brought into contact with the workpiece, as illustrated in FIG. 14B. At this time, because the lifter is moving upwardly, the information processing apparatus 1 determines that the priority of the lifter is higher than that of the table. Therefore, the information processing apparatus 1 cancels the unification of the workpiece and the table, unifies the workpiece with the lifter, and continues the simulation. Because the information processing apparatus 1 moves the lifter in a manner unified with the workpiece, the information processing apparatus 1 can simulate the lifter picking up the workpiece on the table, as illustrated in FIG. 14C.

Figure 15A:
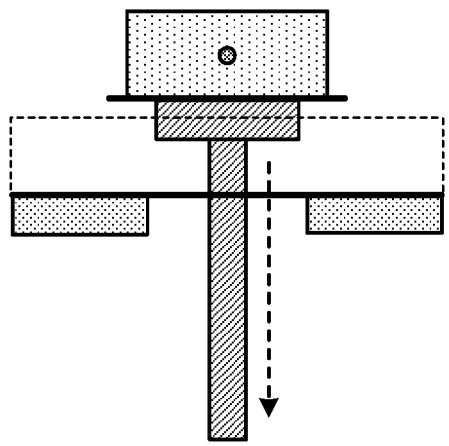
FIG. 15A is a first schematic for explaining a movement of a workpiece when a lifter is moving downwardly.
Figure 15B:
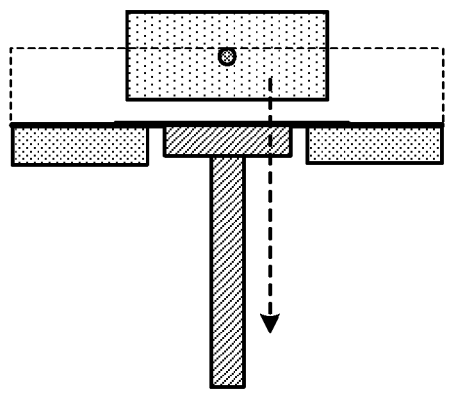
FIG. 15B is a second schematic for explaining the movement of the workpiece when the lifter is moving downwardly.
Figure 15C:
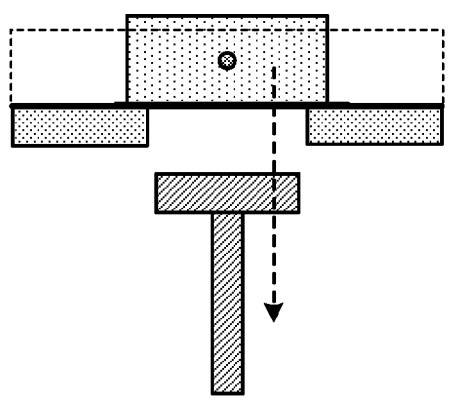
FIG. 15C is a third schematic for explaining the movement of the workpiece when the lifter is moving downwardly.

A simulation in which a workpiece is transferred from a lifter being moved downwardly onto a table will now be explained with reference to FIGS. 15A to 15C. FIG. 15A is a first schematic for explaining the movement of the workpiece when the lifter is moving downwardly. FIG. 15B is a second schematic for explaining the movement of the workpiece when the lifter is moving downwardly. FIG. 15C is a third schematic for explaining the movement of the workpiece when the lifter is moving downwardly.

For example, a lifter unified with the workpiece is moving downwardly, as illustrated in FIG. 15A. In such a case, the information processing apparatus 1 sets the priority of the lifter to a priority lower than that of the table. The information processing apparatus 1 then continues the simulation in which the lifter conveying the workpiece moves downwardly, until the center of gravity of the workpiece comes to be included in the conveyable region of the table.

The center of gravity of the workpiece then comes to be included in the conveyable region of the table, as illustrated in FIG. 15B. The information processing apparatus 1 then determines that the priority of the lifter is lower than that of the table, and cancels the unification of the workpiece and the lifter. The information processing apparatus 1 then unifies the workpiece with the table. The information processing apparatus 1 then places the workpiece on the table, and continues the simulation in which the lifter not conveying the workpiece keeps moving downwardly, as illustrated in FIG. 15C. In this manner, the information processing apparatus 1 can easily simulate a lifter picking up a workpiece placed on a table and conveying the workpiece to another table, without defining the conveyance state of the workpiece in advance.

Figure 16A:
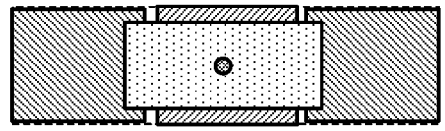
FIG. 16A is a first schematic for explaining a change in the orientation of a workpiece.
Figure 16B:
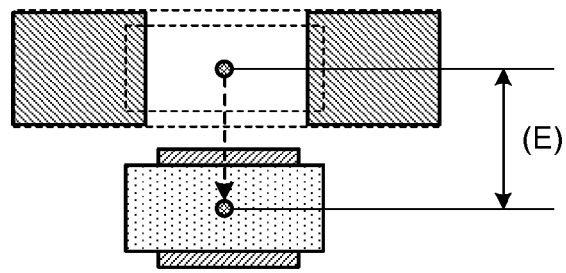
FIG. 16B is a second schematic for explaining another change in the orientation of a workpiece.

A simulation in which a lifter conveying a workpiece moves more than a predetermined distance in the horizontal direction will now be explained with reference to FIGS. 16A and 16B. FIG. 16A is a first schematic for explaining a change in the orientation of the workpiece. FIG. 16B is a second schematic for explaining a change in the orientation of the workpiece.

For example, when a lifter unified with a workpiece is moving downwardly from the position from which the workpiece is started being conveyed, the information processing apparatus 1 acquires a vector whose starting point is at the center of gravity of the workpiece at the time of being started being conveyed and whose ending point is at the current center of gravity of the workpiece. If the horizontal direction component of the vector acquired is smaller than a particular threshold, that is, if the movement of the lifter consist almost only of a vertical movement, as illustrated in FIG. 16A, the information processing apparatus 1 unifies the workpiece with a table at the position at which conveyance is started.

If the horizontal direction component of the vector acquired is larger than the particular threshold, that is, if the movement of the center of gravity of the workpiece is larger than the particular threshold, as illustrated by (E) in FIG. 16B, the information processing apparatus 1 keeps lowering the lifter while keeping the workpiece unified with the lifter. In this manner, the information processing apparatus 1 can easily simulate a lifter picking up a workpiece placed on a table, and conveying the workpiece onto another table positioned lower than the original table, for example.

Figure 17:
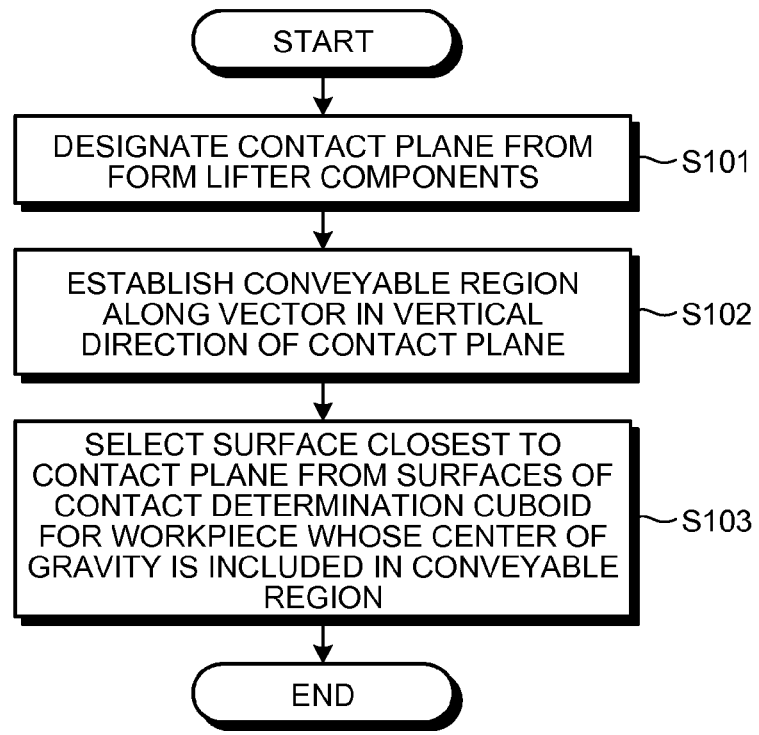
FIG. 17 is a flowchart for explaining a process of selecting a contact plane.

A process performed by the information processing apparatus 1 will now be explained with reference to FIGS. 17 to 21. To begin with, a process performed when the information processing apparatus 1 selects a contact plane will be explained with reference to FIG. 17. FIG. 17 is a flowchart for explaining the process of selecting a contact plane.

For example, the information processing apparatus 1 designates a contact plane on which a workpiece is conveyed, from the form components of the lifter (Step S101). The information processing apparatus 1 then sets a conveyable region along a vector in the vertical direction of the contact plane (Step S102). The information processing apparatus 1 then selects a surface of the workpiece whose center of gravity is included in the conveyable region, as a surface to be brought into contact with the lifter, on the basis that such a surface is closest to the contact plane, from the contact determining cuboid table (Step S103), and ends the process.

Figure 18:
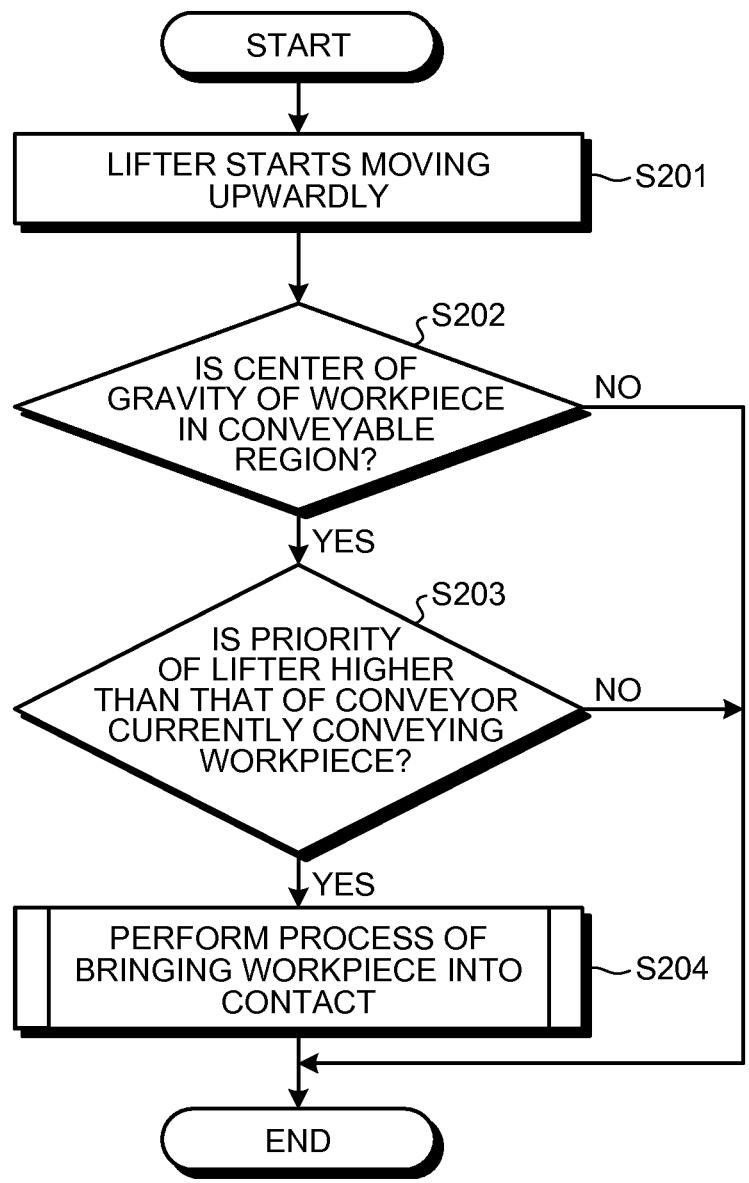
FIG. 18 is a flowchart for explaining a process performed when a lifter is moving upwardly.

A process performed by the information processing apparatus 1 when a lifter is moving upwardly will now be explained with reference to FIG. 18. FIG. 18 is a flowchart for explaining the process performed when the lifter is moving upwardly. Illustrated in the example illustrated in FIG. 18 is an example in which a lifter not conveying a workpiece is started moving upwardly.

For example, when the lifter starts moving upwardly (Step S201), the information processing apparatus 1 determines if there is any workpiece whose center of gravity is included in the conveyable region of the lifter (Step S202). If the information processing apparatus 1 determines that there is any workpiece whose center of gravity is included in the conveyable region of the lifter (YES at Step S202), the information processing apparatus 1 further determines if the priority of the lifter is higher than that of the conveyor currently conveying the workpiece (Step S203).

If the information processing apparatus 1 determines that the priority of the lifter is higher than that of the conveyor currently conveying the workpiece (YES at Step S203), the information processing apparatus 1 performs the process of bringing the workpiece into contact with the lifter (Step S204), and ends the process. If the information processing apparatus 1 determines that there is no workpiece whose center of gravity is included in the conveyable region of the lifter (NO at Step S202), the information processing apparatus 1 ends the process without executing Step S203 and Step S204. If the information processing apparatus 1 determines that the priority of the lifter is lower than that of the conveyor currently conveying the workpiece (NO at Step S203), the information processing apparatus 1 ends the process without executing Step S204.

Figure 19:
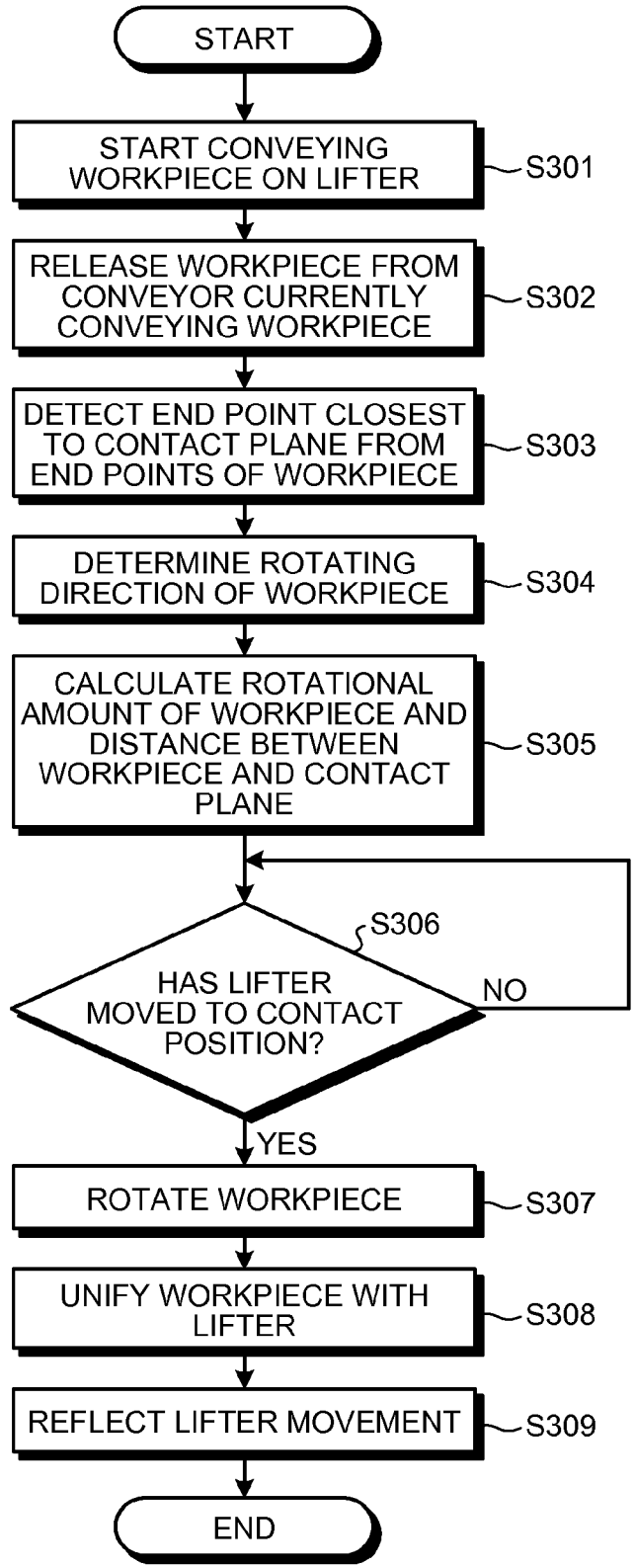
FIG. 19 is a flowchart for explaining a process of bringing a workpiece into contact.

The process of bringing the workpiece into contact indicated at Step S204 in FIG. 18 will now be explained with reference to FIG. 19. FIG. 19 is a flowchart for explaining the process of bringing the workpiece into contact. For example, the information processing apparatus 1 starts conveying a workpiece on the lifter (Step S301). To begin with, the information processing apparatus 1 cancels the unification of the workpiece and the conveyor conveying the workpiece (Step S302). From the end points of a contact determination cuboid for a workpiece, the information processing apparatus 1 detects the end point closest to the contact plane of the lifter (Step S303). The information processing apparatus 1 then determines the rotating direction in which the workpiece is to be rotated about the end point thus detected in order to bring the side of the contact determination cuboid closest to the contact plane of the lifter in parallel with the contact plane (Step S304).

The information processing apparatus 1 then calculates the rotational amount of the workpiece, and the distance between the contact determination cuboid and the contact plane (Step S305). The information processing apparatus 1 then determines if the lifter has moved by the distance thus calculated. In other words, the information processing apparatus 1 determines if the lifter has moved to a position at which the lifter is to be brought into contact with the workpiece (Step S306). If the lifter has not moved to the position of the workpiece yet (NO at Step S306), the information processing apparatus 1 determines again, at the next time step, if the lifter has moved to the workpiece contact position (Step S306).

If the lifter has moved to the workpiece contact position (YES at Step S306), the information processing apparatus 1 causes the workpiece to rotate by the amount calculated at Step S305 (Step S307). The information processing apparatus 1 then unifies the workpiece with the lifter (Step S308), and reflects the movement to the lifter position and the workpiece position (Step S309), and ends the process.

Figure 20:
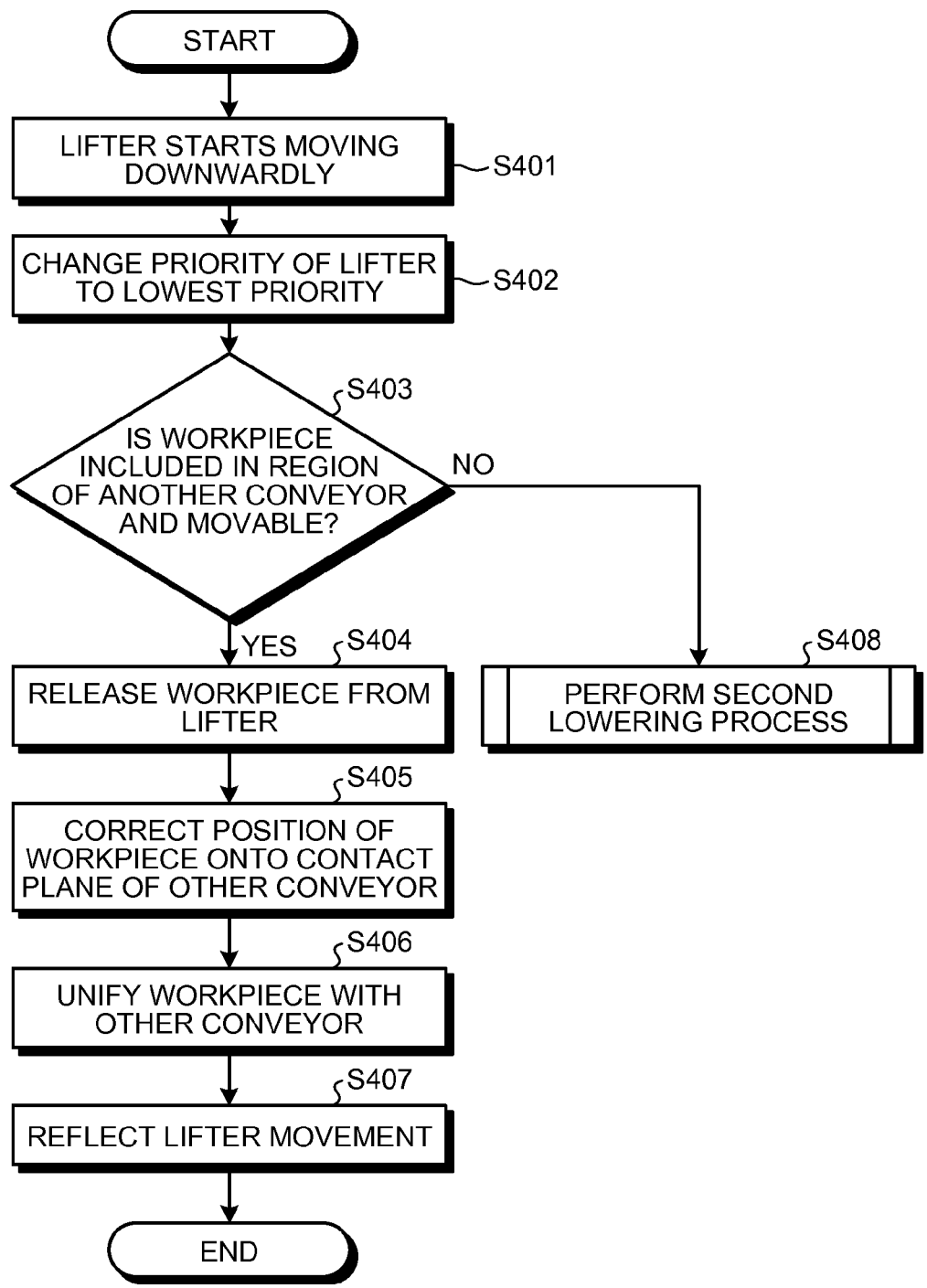
FIG. 20 is a flowchart for explaining a process performed when a lifter is moving downwardly.

Explained now is a process performed by the information processing apparatus 1 when the lifter is moving downwardly. FIG. 20 is a flowchart for explaining a process performed when the lifter is moving downwardly. Illustrated in FIG. 20 is a process performed when a lifter conveying a workpiece is to be lowered.

To begin with, when the lifter starts moving downwardly (Step S401), the information processing apparatus 1 changes the priority of the lifter to the lowest priority (Step S402). The information processing apparatus 1 then determines if the center of gravity of the workpiece currently being conveyed by the lifter is in the conveyable region of another conveyor, and if the workpiece is movable (Step S403). If the center of gravity of the workpiece currently being conveyed by the lifter is in the conveyable region of another conveyor and if the workpiece is movable (YES at Step S403), the information processing apparatus 1 cancels the unification of the workpiece and the lifter (Step S404).

The information processing apparatus 1 then corrects the position of the workpiece onto the contact plane of the other conveyor (Step S405), and unifies the workpiece with the other conveyor (Step S406). In other words, the information processing apparatus 1 transfers the workpiece from the lifter moving downwardly to the other conveyor. The information processing apparatus 1 then reflects the movement of the lifter (Step S407), and ends the process. If the center of gravity of the workpiece currently being conveyed by the lifter is not in the conveyable region of another conveyor, or if the workpiece is not movable (NO at Step S403), the information processing apparatus 1 performs a second lowering process illustrated in FIG. 21 (Step S408).

Figure 21:
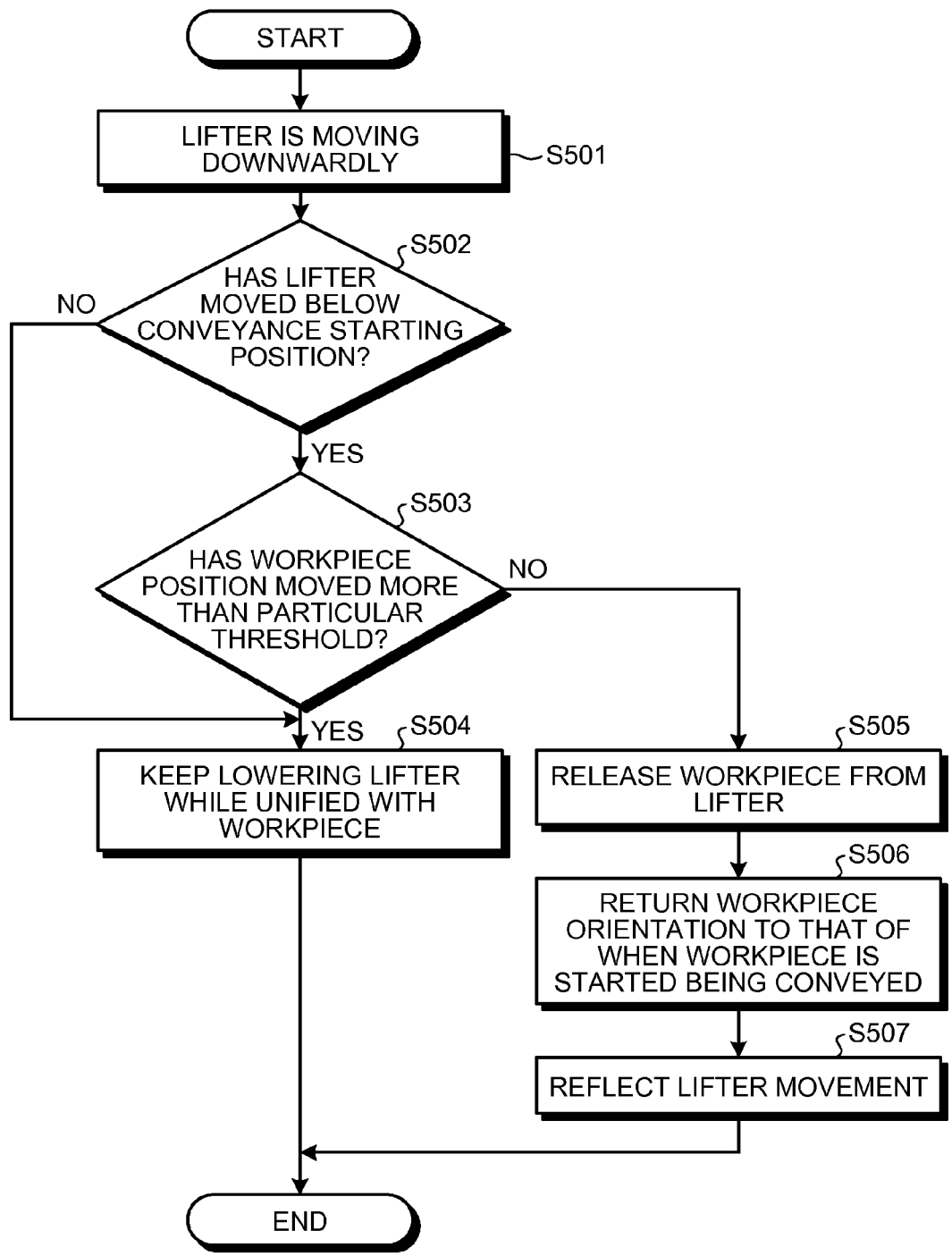
FIG. 21 is a flowchart for explaining a second lowering process.

The second lowering process indicated at Step S408 in FIG. 20 will now be explained with reference to FIG. 21. FIG. 21 is a flowchart for explaining the second lowering process. For example, when the lifter starts moving downwardly (Step S501), the information processing apparatus 1 determines if the lifter has moved below a position where the lifter has started conveying the workpiece in a manner unified with the lifter (Step S502).

If the information processing apparatus 1 determines that the lifter has moved below the position where the lifter has started conveying the workpiece in a manner unified with the lifter (YES at Step S502), the information processing apparatus 1 further determines if the workpiece position has moved more than a particular threshold (Step S503). In other words, the information processing apparatus 1 determines if a horizontal component of the components of a vector by which the workpiece has moved has exceeded the particular threshold (Step S503).

If the workpiece position has moved more than the particular threshold (YES at Step S503), the information processing apparatus 1 keeps lowering the lifter while keeping the workpiece unified with the lifter (Step S504), and ends the process. If the workpiece position has not moved more than the particular threshold (NO at Step S503), the information processing apparatus 1 cancels the unification of the workpiece and the lifter (Step S505).

The information processing apparatus 1 then returns the workpiece to the orientation of the time at which the workpiece has started being conveyed (Step S506), reflects the movement of the lifter (Step S507), and ends the process. In other words, the information processing apparatus 1 returns the workpiece to the position where the workpiece has started being conveyed. If the information processing apparatus 1 determines that the lifter unified with the workpiece has not moved below the position where the lifter has started conveying the workpiece (NO at Step S502), the information processing apparatus 1 skips Step S503, and performs Step S504.

Advantageous Effects Achieved by Information Processing Apparatus 1

As described above, the information processing apparatus 1 simulates a movement of a workpiece and an operation of a lifter that conveys the workpiece in a three dimensional simulated space. When the lifter moves the workpiece placed on a table upwardly, the information processing apparatus 1 sets the priority for unifying the workpiece with the lifter higher than the priority for unifying the workpiece with the table. When the lifter unified with the workpiece is moving downwardly, the information processing apparatus 1 sets the priority of the lifter lower than the priority of the table.

Therefore, the information processing apparatus 1 can cause the conveyance state of the workpiece to be transitioned in a flexible manner. For example, the information processing apparatus 1 can easily perform a simulation such as a lifter picking up a workpiece from a table, conveying the workpiece, and transferring the workpiece onto another table, for example, without specifying the transitional states of the workpiece in advance. Furthermore, even when the order of the conveyors conveying the workpiece is changed because of a change in the design of the control software, for example, the information processing apparatus 1 can simulate the lifters conveying the workpiece.

Furthermore, because the information processing apparatus 1 unifies a workpiece with a lifter and then calculates the workpiece position, errors in the workpiece position can be prevented even when the lifter is caused to move at a high speed. As a result, the information processing apparatus 1 can create a high speed simulation image while maintaining the same precision.

Furthermore, the information processing apparatus 1 determines if a horizontal component of a vector starting from the center of gravity of the workpiece of when the lifter has lifted the workpiece from the table and ending at the center of gravity of the workpiece currently being conveyed by the lifter has exceeded a particular threshold. If the lifter has moved downwardly from the table from which the lifter has lifted the workpiece and if the horizontal component of the vector has not exceeded the particular threshold, the information processing apparatus 1 places the workpiece again to the original position.

If the lifter has moved downwardly from the table from which the lifter has lifted the workpiece, and the horizontal component of the vector has exceeded the particular threshold, the information processing apparatus 1 simulates the lifter moving downwardly while keeping the workpiece unified with the lifter. Therefore, the information processing apparatus 1 can compute a simulation in which a lifter transfers a workpiece from a table to another table at different height. Furthermore, the information processing apparatus 1 can return the workpiece to the original position when the simulation in which the lifter lifts a workpiece from a table is rewound and displayed in real time.

Furthermore, the information processing apparatus 1 determines if the center of gravity of a workpiece on a table is included in the conveyable region of a lifter. If the center of gravity of the workpiece on the table is determined to be included in the conveyable region of the lifter, the information processing apparatus 1 compares the priority of the table and the priority of the lifter. If the priority of the lifter is higher than that of the table, the information processing apparatus 1 unifies the workpiece on the table with the lifter, and simulates an operation of the lifter.

Therefore, the information processing apparatus 1 can perform a realistic simulation. For example, the information processing apparatus 1 does not unify the workpiece with the lifter when a lifter is vertically moving upwardly in a direction not overlapping with a workpiece, and the information processing apparatus 1 unifies the workpiece with the lifter only when the lifter comes up from the bottom of the workpiece. Therefore, the information processing apparatus 1 can perform a realistic simulation.

If the priority of the table is higher than that of the lifter, the information processing apparatus 1 identifies the end point closest to the contact plane of the lifter from the end points of the contact determination cuboid around the workpiece, and identifies the side closest to the contact plane of the lifter from the sides of the contact determination cuboid around the workpiece. The information processing apparatus 1 then rotates the workpiece around the end point thus identified so that the side thus identified comes in parallel with the contact plane of the lifter. The information processing apparatus 1 then unifies the workpiece thus rotated with the lifter, and executes a simulation. As a result, the information processing apparatus 1 can avoid accumulation of errors in the workpiece position by executing the simulations while the workpiece is buried in the lifter.

Furthermore, because the information processing apparatus 1 determines the rotational center and the rotating direction of a workpiece using a contact determination cuboid circumscribed around the workpiece, the information processing apparatus 1 can rotate the workpiece without increasing the computational loads.

When a workpiece unified with a lifter is included in a conveyable region of a table, the information processing apparatus 1 compares the priority of the lifter with that of the table. If the priority of the lifter is higher than that of the table, the information processing apparatus 1 cancels the unification of the workpiece and the lifter, and positions the workpiece on the table. When the lifter is not moving or is moving downwardly, the information processing apparatus 1 sets the priority of the lifter lower than that of the table. Therefore, the information processing apparatus 1 can perform a simulation in which the lifter conveying the workpiece is moving downwardly and places the workpiece onto the table, without using any list indicating the conveyance state of the workpiece.

[b] Second Embodiment

The first embodiment of the present invention is explained above, but other embodiments may also be implemented in different manners. Therefore, some other embodiments of the present invention will now be explained as a second embodiment of the present invention.

(1) Contact Determination Cuboid

The information processing apparatus 1 described above uses a cuboid circumscribed around each of the workpieces as a contact determination cuboid. However, the embodiment is not limited thereto. For example, the information processing apparatus 1 may receive any contact determination cuboid specified by a user from the input device 2, and store the contact determination cuboid in the contact determining cuboid table 7a. The information processing apparatus 1 may then correct the position of the contact determination cuboid stored in the contact determining cuboid table 7a based on the workpiece position having calculated previously. The information processing apparatus 1 also may determine if each of the conveyors is brought into contact with the workpiece using the position of the contact determination cuboid thus corrected.

(2) Functional Configuration of Information Processing Apparatus 1

The information processing apparatus 1 stores the position of the contact determination cuboid and the position of the contact plane of each of the conveyors in the operation parameter storage unit 7 at each time step of a simulation. The information processing apparatus 1 then calculates the position of the workpiece and the position of each of the conveyors at the next time step using various types of information stored in the operation parameter storage unit 7. However, the embodiment is not limited thereto.

For example, the information processing apparatus 1 may store therein only the initial position of the contact determination cuboid and the contact plane of each of the conveyors in the operation parameter storage unit 7. The information processing apparatus 1 may then execute a simulation of a first time step using the amount of movement of each of the conveyors calculated by the lifter operation computing unit 13, and the initial position of the contact plane of the contact determination cuboid stored in the operation parameter storage unit 7. The information processing apparatus 1 may then store the position of the workpiece and the position of each of the conveyors from the simulation result of the first time step, and calculate the simulation result for the next time step using the information thus stored and a new amount of movement of each of the conveyors.

(3) Workpieces and Conveyors

The workpieces and the different types of conveyors explained in the first embodiment are merely examples, and the information processing apparatus 1 can perform any simulation of any workpiece having any form and any conveyor having any form. Furthermore, the various conveyors mentioned above are merely examples, and the information processing apparatus 1 can perform any simulation of any conveyor having any functions.

(4) Implementation

The information processing apparatus 1 described above performs a simulation using a single piece of hardware. However, the embodiment is not limited thereto. For example, the functions achieved by the information processing apparatus 1 may be divided in any granularity, and different servers may be used to achieve the respective functions thus divided. In other words, the information processing apparatus 1 may be realized by what is called a cloud system.

(5) Computer Program

Figure 22:
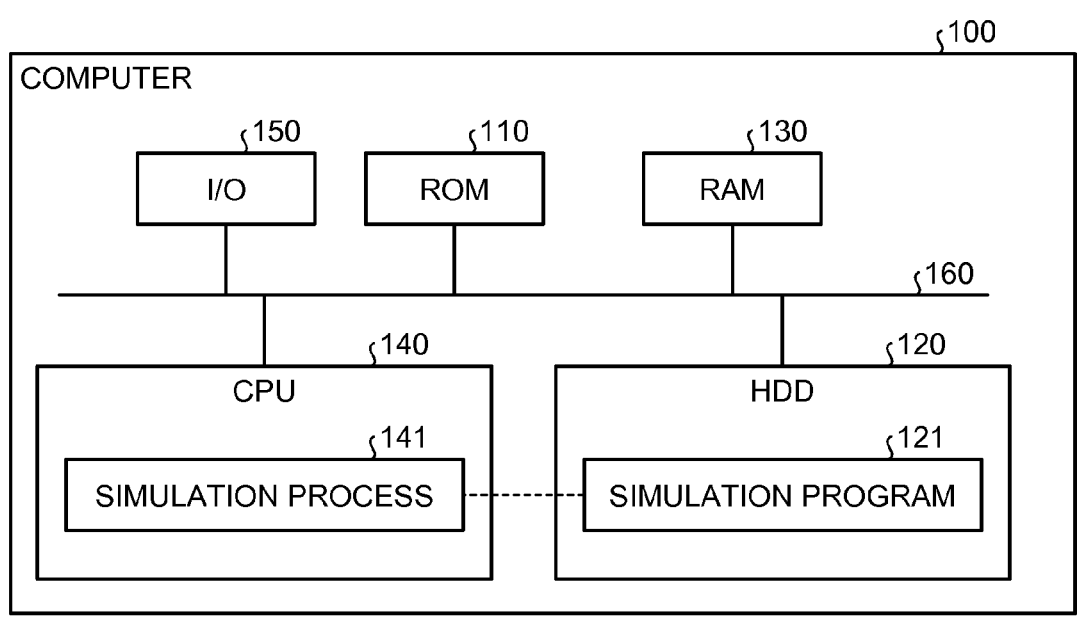
FIG. 22 is a schematic for explaining an example of a computer for executing a simulation program.

The information processing apparatus 1 according to the first embodiment is explained to perform various processes using hardware. However, the embodiment is not limited thereto, and a computer program prepared in advance may cause a computer provided to the information processing apparatus 1 to execute the processes. Therefore, explained now with reference to FIG. 22 is an example of a computer executing a computer program having the same functions as those in the information processing apparatus 1 according to the first embodiment. FIG. 22 is a schematic for explaining an example of such a computer for executing a simulation program.

A computer 100 illustrated as an example in FIG. 22 includes a read-only memory (ROM) 110, a hard disk drive (HDD) 120, a random access memory (RAM) 130, and a central processing unit (CPU) 140 all of which are connected over a bus 160. The computer 100 illustrated as an example in FIG. 22 also includes an input-output (I/O) 150 for transmitting and receiving packets.

The HDD 120 is caused to retain a simulation program 121 in advance. When the CPU 140 reads the simulation program 121 from the HDD 120 and executes the simulation program 121, the simulation program 121 is caused to function as a simulation process 141, in the example illustrated in FIG. 22. The simulation process 141 achieves the same functions as those achieved by the simulation computing unit 11, the three-dimensional orientation computing unit 16, and the three dimensional form display controlling unit 17 illustrated in FIG. 1.

The simulation program 121 explained in the fourth embodiment can be realized by causing a computer such as a personal computer or a workstation to execute the computer program prepared in advance. The computer program may also be distributed over a network such as the Internet. The computer program may also be stored in a computer-readable recording medium such as a hard disk, a flexible disk (FD), a compact disc read-only memory (CD-ROM), a magneto-optical disc (MO), or a digital versatile disc (DVD). The computer program may then be read from the recording medium and executed by a computer.

According to an aspect of the embodiments, it is possible to provide a computing apparatus and a computing method which allow the conveyance state of a workpiece to be transitioned flexibly.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A non-transitory computer-readable recording medium having stored therein a computer program for a simulation in which an article, a conveyor performing an operation of moving the article upwardly by supporting the article from bottom using a contact plane of a lifter, and a table on which the article is to be placed are plotted in a three dimensional simulated space, and in which the conveyor conveys the article, the computer program causing a computer to execute a process comprising:

setting a first priority representing a degree at which the lifter is handled as a single unit as the article higher than a second priority representing a degree at which the table is handled as a single unit as the article when the lifter of the conveyor moves the article placed on the table upwardly by executing a control program for controlling the conveyor, the control program being a debugging target;

setting the first priority lower than the second priority when the lifter conveying the article moves downwardly below the table;

comparing the first priority and the second priority when the article is included in both a conveyable region of the lifter set on the contact plane of the lifter and a conveyable region of the table set on a contact plane of the table that is to be unified with the article;

computing movement of the article assuming that the article is unified with either the lifter or the table whose priority is higher; and displaying a simulation result in the three dimensional simulated space based on the computing of the movement of the article for debugging of the control program.

2. The non-transitory computer-readable recording medium according to claim 1, wherein the computing comprises:
determining whether a horizontal component of a vector starting at a coordinate position of center of gravity of the article when the lifter picks up the article from the table and ending at a current coordinate position of the center of gravity of the article exceeds a predetermined threshold; and
plotting the article conveyed by the lifter on the table again when the lifter conveying the article moves downwardly below the table and the horizontal component of the vector is determined not to exceed the predetermined threshold.

3. The non-transitory computer-readable recording medium according to claim 1, wherein the comparing comprises:
determining whether the article placed on the table is included in the conveyable region of the lifter; and
comparing the first priority and the second priority when the article placed on the table is determined to be included in the conveyable region of the lifter; and
the computing comprises
handling the article placed on the table as a single unit as the lifter when the first priority is higher than the second priority.

4. The non-transitory computer-readable recording medium according to claim 3, wherein the computing comprises:
when the first priority is higher than the second priority, rotating the article about an end point, amongst end points of the article, closest to the lifter so that an edge, amongst edges of the article, closest to the contact plane of the lifter is brought in parallel with the contact plane of the lifter, and handling the rotated article as a single unit as the lifter.

5. The non-transitory computer-readable recording medium according to claim 4, wherein the rotating includes identifying a cuboid circumscribed around the article and rotating the article so that an edge, among edges of the cuboid, that is closest to the contact plane of the lifter is brought in parallel with the contact plane of the lifter.

6. The non-transitory computer-readable recording medium according to claim 1, wherein the comparing comprises:
determining whether the article handled as a single unit as the lifter is included in the conveyable region of the table; and
comparing the first priority and the second priority when the article handled as a single unit as the lifter is included in the conveyable region of the table; and
the computing comprises
plotting the article handled as a single unit as the lifter onto the table when the second priority is higher than the first priority.

7. A computing apparatus executing computations for a simulation in which an article, a conveyor performing an operation of moving the article upwardly by supporting the article from bottom using a contact plane of a lifter, and a table on which the article is to be placed are plotted in a three dimensional simulated space, and in which the conveyor conveys the article, the computing apparatus comprising:
a memory; and
a processor coupled to the memory, wherein the processor executes a process comprising:
setting a first priority representing a degree at which the lifter is handled as a single unit as the article higher than a second priority representing a degree at which the table is handled as a single unit as the article when the lifter of the conveyor moves the article placed on the table upwardly by executing a control program for controlling the conveyor, the control program being a debugging target;
setting the first priority lower than the second priority when the lifter conveying the article moves downwardly below the table;
comparing the first priority and the second priority when the article is included in both a conveyable region of the lifter set on the contact plane of the lifter and a conveyable region of the table set on a contact plane of the table that is to be unified with the article;
computing movement of the article assuming that the article is unified with either the lifter or the table whose priority is higher; and
displaying a simulation result in the three dimensional simulated space based on the computing of the movement of the article for debugging of the control program.

8. A computing method for a simulation in which an article, a conveyor performing an operation of moving the article upwardly by supporting the article from bottom using a contact plane of a lifter, and a table on which the article is to be placed are plotted in a three dimensional simulated space, and in which the conveyor conveys the article, the computing method comprising:
setting, using a processor, a first priority representing a degree at which the lifter is handled as a single unit as the article higher than a second priority representing a degree at which the table is handled as a single unit as the article when the lifter of the conveyor moves the article placed on the table upwardly by executing a control program for controlling the conveyor, the control program being a debugging target;
setting, using the processor, the first priority lower than the second priority when the lifter conveying the article moves downwardly below the table;
comparing the first priority and the second priority when the article is included in both a conveyable region of the lifter set on the contact plane of the lifter and a conveyable region of the table set on a contact plane of the table that is to be unified with the article;
computing movement of the article assuming that the article is unified with either the lifter or the table whose priority is higher; and
displaying a simulation result in the three dimensional simulated space based on the computing of the movement of the article for debugging of the control program.

* * * * *